United States Patent
Dar et al.

(10) Patent No.: US 8,694,854 B1
(45) Date of Patent: Apr. 8, 2014

(54) READ THRESHOLD SETTING BASED ON SOFT READOUT STATISTICS

(75) Inventors: Ronen Dar, Tel Aviv (IL); Eyal Gurgi, Petah-Tikva (IL); Micha Anholt, Tel-Aviv (IL); Naftali Sommer, Rishon Le-Zion (IL)

(73) Assignee: Apple Inc., Cupertino, CA (US)

( * ) Notice: Subject to any disclaimer, the term of this patent is extended or adjusted under 35 U.S.C. 154(b) by 202 days.

(21) Appl. No.: 13/195,852

(22) Filed: Aug. 2, 2011

Related U.S. Application Data

(60) Provisional application No. 61/374,377, filed on Aug. 17, 2010.

(51) Int. Cl.
G11C 29/00 (2006.01)

(52) U.S. Cl.
USPC ............................ 714/763; 714/752; 714/780

(58) Field of Classification Search
USPC .......... 714/763, 719, 733, 752, 780, 793, 808
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotra et al. | |

(Continued)

FOREIGN PATENT DOCUMENTS

| EP | 0783754 B1 | 7/1997 |
|---|---|---|
| EP | 1434236 B1 | 6/2004 |

(Continued)

OTHER PUBLICATIONS

U.S. Appl. No. 12/323,544 Office Action dated Dec. 13, 2011.

(Continued)

*Primary Examiner* — Fritz Alphonse
(74) *Attorney, Agent, or Firm* — Meyertons, Hood, Kivlin, Kowert & Goetzel, P.C.

(57) ABSTRACT

A method for data storage includes storing data in analog memory cells by programming the memory cells with respective analog input values. After storing the data, respective analog output values are read from the memory cells using multiple read thresholds, which define multiple ranges of the analog output values. Respective numbers of read errors in the data, corresponding to the analog output values falling in the ranges, are assessed. The stored data is recovered based on respective numbers of the read errors assessed in the ranges.

39 Claims, 2 Drawing Sheets

(56) References Cited

U.S. PATENT DOCUMENTS

| | | | |
|---|---|---|---|
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yang et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |

(56) References Cited

U.S. PATENT DOCUMENTS

| | | |
|---|---|---|
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhlesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |

(56) References Cited

U.S. PATENT DOCUMENTS

| | | |
|---|---|---|
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,924,613 B1 | 4/2011 | Sommer |
| 7,925,936 B1 | 4/2011 | Sommer |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,975,192 B2 * | 7/2011 | Sommer et al. ............... 714/719 |
| 7,978,516 B2 | 7/2011 | Olbrich et al. |
| 7,995,388 B1 * | 8/2011 | Winter et al. ........... 365/185.03 |
| 8,000,135 B1 | 8/2011 | Perlmutter et al. |
| 8,000,141 B1 | 8/2011 | Shalvi et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 8,438,471 B2 * | 5/2013 | Thorpe et al. ................. 715/234 |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobet |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |

(56) References Cited

U.S. PATENT DOCUMENTS

| | | |
|---|---|---|
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi |
| 2009/0327608 A1 | 12/2009 | Eschmann et al. |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0124088 A1 | 5/2010 | Shalvi et al. |
| 2010/0131697 A1 | 5/2010 | Alrod et al. |
| 2010/0131827 A1 | 5/2010 | Sokolov et al. |
| 2010/0142268 A1 | 6/2010 | Aritome |
| 2010/0142277 A1 | 6/2010 | Yang et al. |
| 2010/0157675 A1 | 6/2010 | Shalvi et al. |
| 2010/0165689 A1 | 7/2010 | Rotbard et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0195390 A1 | 8/2010 | Shalvi |
| 2010/0199150 A1 | 8/2010 | Shalvi et al. |
| 2010/0211803 A1 | 8/2010 | Lablans |
| 2010/0220509 A1 | 9/2010 | Sokolov et al. |
| 2010/0220510 A1 | 9/2010 | Shalvi |
| 2010/0250836 A1 | 9/2010 | Sokolov et al. |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.

(56) References Cited

OTHER PUBLICATIONS

U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
Agrell et al., "Closest Point Search in Lattices", IEEE Transactions on Information Theory, vol. 48, No. 8, pp. 2201-2214, Aug. 2002.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
Berman et al., "Mitigating Inter-Cell Coupling Effects in MLC NAND Flash via Constrained Coding", Flash Memory Summit, Santa Clara, USA, Aug. 19, 2010.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May, 1984, section 3.2, pp. 47-48.
Conway et al., "Sphere Packings, Lattices and Groups", 3rd edition, chapter 4, pp. 94-135, Springer, New York, US 1998.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Compaq et al., "Universal Serial Bus Specification", revision 2.0, Apr. 27, 2000.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), p. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Engineering Windows 7, "Support and Q&A for Solid-State Drives", e7blog, May 5, 2009.
Goodman et al., "On-Chip ECC for Multi-Level Random Access Memories," Proceedings of the IEEE/CAM Information Theory Workshop, Ithaca, USA, Jun. 25-29, 1989.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
Horstein, "On the Design of Signals for Sequential and Nonsequential Detection Systems with Feedback," IEEE Transactions on Information Theory IT-12:4 (Oct. 1966), pp. 448-455.
How to Resolve Bad Super Block: Magic Number Wrong "in BSD", Free Online Articles Director Article Base, posted Sep. 5, 2009.
Huffman, A., "Non-Volatile Memory Host Controller Interface (NVMHCI)", Specification 1.0, Apr. 14, 2008.
Jedec Standard JESD84-C44, "Embedded MultiMediaCard (eMMC) Mechanical Standard, with Optional Reset Signal", Jedec Solid State Technology Association, USA, Jul. 2009.
Jedec, "UFS Specification", version 0.1, Nov. 11, 2009.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 Mb/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Micron Technology Inc., "Memory Management in NAND Flash Arrays", Technical Note, year 2005.
NUMONYX, "M25PE16: 16-Mbit, page-erasable serial flash memory with byte-alterability, 75 MHz SPI bus, standard pinout", Apr. 2008.
Onfi, "Open NAND Flash Interface Specification," revision 1.0, Dec. 28, 2006.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
Park et al., "Sub-Grouped Superblock Management for High-Performance Flash Storages", IEICE Electronics Express, vol. 6, No. 6, pp. 297-303, Mar. 25, 2009.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
SD Group and SD Card Association, "SD Specifications Part 1 Physical Layer Specification", version 3.01, draft 1.00, Nov. 9, 2009.
Serial ATA International Organization, "Serial ATA Revision 3.0 Specification", Jun. 2, 2009.

(56) References Cited

OTHER PUBLICATIONS

Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Super User Forums, "SD Card Failure, can't read superblock", posted Aug. 8, 2010.
Takeuchi et al., "A Double Level $V_{TH}$ Select Gate Array Architecture for Multi-Level Nand Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
UBUNTU Forums, "Memory Stick Failed IO Superblock", posted Nov. 11, 2009.
Wei, L., "Trellis-Coded Modulation With Multidimensional Constellations", IEEE Transactions on Information Theory, vol. IT-33, No. 4, pp. 483-501, Jul. 1987.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Search Report dated May 30, 2008.
International Application PCT/IL2007/000576 Search Report dated Jul. 7, 2008.
International Application PCT/IL2007/000579 Search report dated Jul. 3, 2008.
International Application PCT/IL2007/000580 Search Report dated Sep. 11, 2008.
International Application PCT/IL2007/000581 Search Report dated Aug. 25, 2008.
International Application PCT/IL2007/001059 Search report dated Aug. 7, 2008.
International Application PCT/IL2007/001315 search report dated Aug. 7, 2008.
International Application PCT/IL2007/001316 Search report dated Jul. 22, 2008.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
U.S. Appl. No. 11/957,970 Official Action dated May 20, 2010.
U.S. Appl. No. 12/171,797 Official Action dated Aug. 25, 2010.
U.S. Appl. No. 11/945,575 Official Action dated Aug. 24, 2010.
U.S. Appl. No. 12/497,707 Official Action dated Sep. 15, 2010.
U.S. Appl. No. 11/995,801 Official Action dated Oct. 15, 2010.
U.S. Appl. No. 12/045,520 Official Action dated Nov. 16, 2010.
U.S. Appl. No. 12/388,528 Official Action dated Nov. 29, 2010.
U.S. Appl. No. 11/995,814 Official Action dated Dec. 17, 2010.
U.S. Appl. No. 12/251,471 Official Action dated Jan. 3, 2011.
U.S. Appl. No. 12/534,898 Official Action dated Mar. 23, 2011.
Chinese Application # 200780026181.3 Official Action dated Apr. 8, 2011.
U.S. Appl. No. 12/178,318 Official Action dated May 31, 2011.
U.S. Appl. No. 11/995,813 Official Action dated Jun. 16, 2011.
U.S. Appl. No. 12/344,233 Official Action dated Jun. 24, 2011.
Chinese Patent Application # 200780040493.X Official Action dated Jun. 15, 2011.
U.S. Appl. No. 12/405,275 Official Action dated Jul. 29, 2011.
U.S. Appl. No. 12/649,360 Official Action dated Aug. 9, 2011.
U.S. Appl. No. 13/114,049 Official Action dated Sep 12, 2011.
U.S. Appl. No. 12/037,487 Official Action dated Oct. 3, 2011.
U.S. Appl. No. 12/534,893, filed Aug. 4, 2009.
U.S. Appl. No. 12/551,583, filed Sep. 1, 2009.
U.S. Appl. No. 12/551,567, filed Sep. 1, 2009.
U.S. Appl. No. 12/579,430, filed Oct. 15, 2009.
U.S. Appl. No. 12/579,432, filed Oct. 15, 2009.
U.S. Appl. No. 12/607,078, filed Oct. 28, 2009.
U.S. Appl. No. 12/607,085, filed Oct. 28, 2009.
U.S. Appl. No. 12/649,358, filed Dec. 30, 2009.
U.S. Appl. No. 12/649,360, filed Dec. 30, 2009.
U.S. Appl. No. 12/688,883, filed Jan. 17, 2010.
U.S. Appl. No. 12/728,296, filed Mar. 22, 2010.
U.S. Appl. No. 12/758,003, filed Apr. 11, 2010.
U.S. Appl. No. 12/880,101, filed Sep. 12, 2010.
U.S. Appl. No. 12/890,724, filed Sep. 27, 2010.
U.S. Appl. No. 12/822,207, filed Jun. 24, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 13/114,049, filed May 24, 2011.
U.S. Appl. No. 13/170,202, filed Jun. 28, 2011.
U.S. Appl. No. 13/171,467, filed Jun. 29, 2011.
U.S. Appl. No. 13/176,761, filed Jul. 6, 2011.
U.S. Appl. No. 13/192,495, filed Jul. 28, 2011.
U.S. Appl. No. 13/192,501, filed Jul. 28, 2011.
U.S. Appl. No. 13/192,504, filed Jul. 28, 2011.
U.S. Appl. No. 13/231,963, filed Sep. 14, 2011.
U.S. Appl. No. 13/214,257, filed Aug. 22, 2011.
U.S. Appl. No. 13/239,408, filed Sep. 22, 2011.
U.S. Appl. No. 13/239,411, filed Sep. 22, 2011.
US 7,161,836, Jan. 2007, Wan et al. (withdrawn).

\* cited by examiner

READ THRESHOLD SETTING BASED ON SOFT READOUT STATISTICS

CROSS-REFERENCE TO RELATED APPLICATIONS

This application claims the benefit of U.S. Provisional Patent Application 61/374,377, filed Aug. 17, 2010, whose disclosure is incorporated herein by reference.

FIELD OF THE INVENTION

The present invention relates generally to memory devices, and particularly to methods and systems for setting read thresholds in non-volatile memory devices.

BACKGROUND OF THE INVENTION

Analog memory cells, such as Flash memory cells, are typically read by comparing the analog cell values to one or more read thresholds. Various techniques for setting and adjusting read thresholds are known in the art. For example, U.S. Pat. No. 5,657,332, whose disclosure is incorporated herein by reference, describes methods for recovering from hard errors in a solid-state memory system. A memory system includes an array of memory cells, each cell capable of having its threshold voltage programmed or erased to an intended level. An error checking scheme is provided for each of a plurality of groups of cells for identifying read errors therein. A read reference level is adjusted before each read operation on the individual group of cells containing read errors, each time the read reference level being displaced a predetermined step from a reference level for normal read, until the error checking means no longer indicates read errors. The drifted threshold voltage of each cell associated with a read error is re-written to its intended level.

U.S. Patent Application Publication 2007/0091677, whose disclosure is incorporated herein by reference, describes techniques for reading data from one or more Flash memory cells, and for recovering from read errors. In some embodiments, in the event of an error correction failure by an error detection and correction module, the Flash memory cells are re-read at least once using one or more modified reference voltages, until successful error correction may be carried out.

U.S. Pat. No. 6,963,505, whose disclosure is incorporated herein by reference, describes methods for determining a reference voltage. In some embodiments, a set of operating reference cells is established to be used in operating cells in a Non-Volatile Memory (NVM) block or array. At least a subset of cells of the NVM block or array may be read using each of two or more sets of test reference cells, where each set of test reference cells may generate or otherwise provide reference voltages at least slightly offset from each other set of test reference cells. For each set of test reference cells used to read at least a subset of the NVM block, a read error rate may be calculated or otherwise determined. A set of test reference cells associated with a relatively low read error rate may be selected as the set of operating reference cells to be used in operating other cells, outside the subset of cells, in the NVM block or array.

U.S. Patent Application Publication 2010/0091535, whose disclosure is incorporated herein by reference, describes various techniques for adjusting read thresholds of analog memory cells. In one of the disclosed techniques, data is encoded with an Error Correction Code (ECC) before it is stored in the memory cells. When retrieving data from the memory cells, the ECC is decoded in order to correct read errors. For a given read error that was corrected by the ECC, the direction of the error, i.e., the programming level with which the read storage value was erroneously associated before applying ECC correction, is determined. Information regarding directions of corrected errors is used for adjusting the read thresholds.

SUMMARY OF THE INVENTION

A method for data storage includes storing data in analog memory cells by programming the memory cells with respective analog input values. After storing the data, respective analog output values are read from the memory cells using multiple read thresholds, which define multiple ranges of the analog output values. Respective numbers of read errors in the data, corresponding to the analog output values falling in the ranges, are assessed. The stored data is recovered based on respective numbers of the read errors assessed in the ranges.

In some embodiments, recovering the stored data includes adjusting at least one of the read thresholds based on the respective numbers of the read errors, and retrieving the data from the memory cells using the adjusted read thresholds. In an embodiment, adjusting the read thresholds includes adapting the read thresholds based on the numbers of the read errors assessed in a first group of the memory cells, and retrieving the data includes reading the data from a second group of the memory cells using the adapted read thresholds.

In another embodiment, adjusting the read thresholds includes adapting the read thresholds based on the numbers of the read errors assessed in given group of the memory cells, and retrieving the data includes reading the data from the given group of the memory cells using the adapted read thresholds. In yet another embodiment, adjusting the read thresholds includes moving the multiple read thresholds while preserving separations between the read thresholds. In still another embodiment, adjusting the read thresholds includes modifying one or more separations between the read thresholds.

In a disclosed embodiment, the method includes holding a mapping that defines multiple sets of the read thresholds depending on one or more parameters related to the analog output values, and adjusting the read thresholds includes estimating the parameters based on the read analog output values, and obtaining the read thresholds from the mapping using the estimated parameters. In an embodiment, adjusting the read thresholds includes modeling readout of the data using a communication channel model, and adapting the read thresholds so as to maximize a capacity of the communication channel model.

In some embodiments, the read thresholds include at least a hard threshold and two soft thresholds on opposite sides of the hard threshold, and the ranges include at least a first range between the hard threshold and one of the soft thresholds, and a second range between the hard threshold and the other of the soft thresholds. In an embodiment, storing the data includes programming each memory cell to a respective one of multiple programming levels, and reading the analog output values includes positioning the multiple read thresholds in a boundary region between a given pair of the programming levels.

In a disclosed embodiment, recovering the stored data includes computing soft decoding metrics based on the respective numbers of the read errors, and decoding an Error Correction Code (ECC) that encodes the stored data using the soft decoding metrics. Recovering the stored data may include computing the soft decoding metrics over a first group of the memory cells, and decoding the ECC that encodes the data stored in a second group of the memory cells.

In another embodiment, storing the data includes encoding the data with an Error Correction Code (ECC), and assessing the numbers of the read errors includes correcting the read errors using the ECC and determining a respective count of the read errors in each range that were corrected by the ECC. In yet another embodiment, storing the data includes programming each memory cell to a respective one of multiple programming levels, and the analog output values corresponding to at least one of the programming levels are distributed in accordance with a non-Gaussian distribution.

There is additionally provided, in accordance with an embodiment of the present invention, a data storage apparatus including an interface and circuitry. The interface is configured to communicate with a memory including analog memory cells. The circuitry is configured to store data in the analog memory cells of the memory by programming the memory cells with respective analog input values, to read, after storing the data, respective analog output values from the memory cells using multiple read thresholds that define multiple ranges of the analog output values, to assess a respective number of read errors in the data corresponding to the analog output values falling in each of the ranges, and to adjust at least one of the read thresholds based on respective numbers of the read errors assessed in the ranges.

There is also provided, in accordance with an embodiment of the present invention, a data storage apparatus including a memory and circuitry. The memory includes analog memory cells. The circuitry is configured to store data in the analog memory cells of the memory by programming the memory cells with respective analog input values, to read, after storing the data, respective analog output values from the memory cells using multiple read thresholds that define multiple ranges of the analog output values, to assess a respective number of read errors in the data corresponding to the analog output values falling in each of the ranges, and to adjust at least one of the read thresholds based on respective numbers of the read errors assessed in the ranges.

There is further provided, in accordance with an embodiment of the present invention, a method for data storage. The method includes storing data in analog memory cells by programming the memory cells with respective analog input values. Multiple read thresholds are set for reading respective analog output values from the memory cells. the read thresholds define multiple ranges of the analog output values and are set such that a respective number of the analog output values occurring in each range matches a respective value. The stored data is retrieved by reading the analog output values from the memory cells using the multiple read thresholds.

In an embodiment, setting the read thresholds includes estimating one or more Cumulative Distribution Functions (CDFs) of the analog output values, and setting the read thresholds based on the estimated CDFs. In a disclosed embodiment, the method includes holding a mapping that defines multiple sets of the read thresholds depending on one or more parameters related to the analog output values, and setting the read thresholds includes estimating the parameters based on the read analog output values, and obtaining the read thresholds from the mapping using the estimated parameters. In another embodiment, setting the read thresholds includes modeling readout of the data using a communication channel model, and adapting the read thresholds so as to maximize a capacity of the communication channel model.

There is also provided, in accordance with an embodiment of the present invention, a data storage apparatus including an interface and circuitry. The interface is configured to communicate with a memory including analog memory cells. The circuitry is configured to store data in the analog memory cells by programming the memory cells with respective analog input values, to set multiple read thresholds for reading respective analog output values from the memory cells, wherein the read thresholds define multiple ranges of the analog output values and are set such that a respective number of the analog output values occurring in each range matches a respective value, and to retrieve the stored data by reading the analog output values from the memory cells using the multiple read thresholds.

There is moreover provided, in accordance with an embodiment of the present invention, a data storage apparatus including a memory and circuitry. The memory includes analog memory cells. The circuitry is configured to store data in the analog memory cells by programming the memory cells with respective analog input values, to set multiple read thresholds for reading respective analog output values from the memory cells, wherein the read thresholds define multiple ranges of the analog output values and are set such that a respective number of the analog output values occurring in each range matches a respective value, and to retrieve the stored data by reading the analog output values from the memory cells using the multiple read thresholds.

There is additionally provided, in accordance with an embodiment of the present invention, a method for data storage including holding a mapping that defines multiple sets of read thresholds for reading analog memory cells depending on one or more parameters related to analog values read from the memory cells. Data is stored in a group of the analog memory cells by programming the memory cells in the group with respective analog input values. After storing the data, respective analog output values are read from the memory cells in the group and the parameters are estimated based on the read analog output values. The read thresholds are set for subsequent readout operations based on the mapping using the estimated parameters.

In some embodiments, the parameters include a variance of a distribution of at least some of the analog output values, a width of the distribution and/or a distance between distributions of subsets of the analog output values.

There is also provided, in accordance with an embodiment of the present invention, a data storage apparatus including an interface and circuitry. The interface is configured to communicate with a memory including analog memory cells. The circuitry is configured to hold a mapping that defines multiple sets of read thresholds for reading analog memory cells depending on one or more parameters related to analog values read from the memory cells, to store data in a group of the analog memory cells by programming the memory cells in the group with respective analog input values, to read, after storing the data, respective analog output values from the memory cells in the group and to estimate the parameters based on the read analog output values, and to set the read thresholds for subsequent readout operations based on the mapping using the estimated parameters.

There is further provided, in accordance with an embodiment of the present invention, a data storage apparatus including a memory and circuitry. The memory includes analog memory cells. The circuitry is configured to hold a mapping that defines multiple sets of read thresholds for reading analog memory cells depending on one or more parameters related to analog values read from the memory cells, to store data in a group of the analog memory cells by programming the memory cells in the group with respective analog input values, to read, after storing the data, respective analog output values from the memory cells in the group and to estimate the parameters based on the read analog output values, and to set the read thresholds for subsequent readout operations based on the mapping using the estimated parameters.

There is furthermore provided, in accordance with an embodiment of the present invention, a method for data storage including storing data in analog memory cells by programming the memory cells with respective analog input values. After storing the data, respective analog output values are read from the memory cells using multiple read thresholds. Readout of the data is modeled using a communication channel model, and the read thresholds are adapted so as to maximize a capacity of the communication channel model.

There is also provided, in accordance with an embodiment of the present invention, a data storage apparatus including an interface and circuitry. The interface is configured to communicate with a memory including analog memory cells. The circuitry is configured to store data in the analog memory cells by programming the memory cells with respective analog input values, to read, after storing the data, respective analog output values from the memory cells using multiple read thresholds, to model readout of the data using a communication channel model, and to adapt the read thresholds so as to maximize a capacity of the communication channel model.

There is additionally provided, in accordance with an embodiment of the present invention, a data storage apparatus including a memory and circuitry. The memory includes analog memory cells. The circuitry is configured to store data in the analog memory cells by programming the memory cells with respective analog input values, to read, after storing the data, respective analog output values from the memory cells using multiple read thresholds, to model readout of the data using a communication channel model, and to adapt the read thresholds so as to maximize a capacity of the communication channel model.

The present invention will be more fully understood from the following detailed description of the embodiments thereof, taken together with the drawings in which:

DETAILED DESCRIPTION OF EMBODIMENTS

Overview

Figure 1:
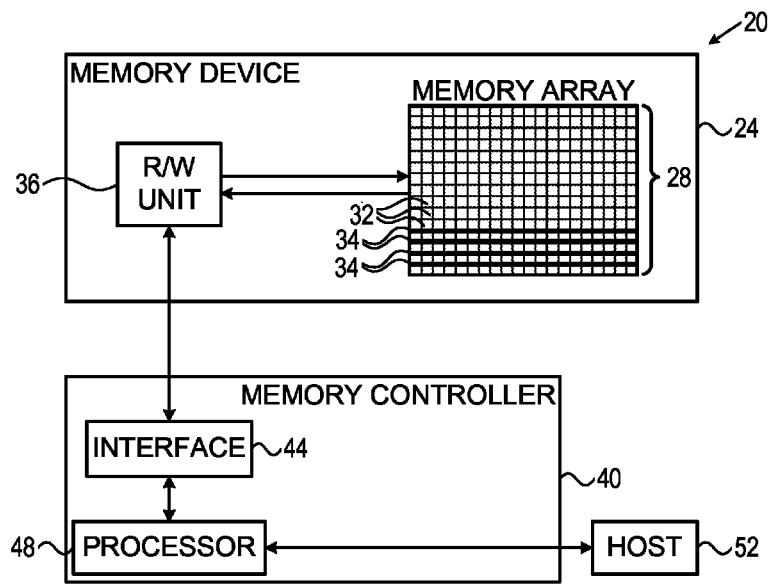
FIG. 1 is a block diagram that schematically illustrates a memory system, in accordance with an embodiment of the present invention.

In memory devices such as Flash memory, data is stored in analog memory cells by programming the memory cells to respective analog input values that represent the stored bit values. Data is retrieved by comparing respective analog output values of the memory cells to one or more read thresholds. In other words, each bit value corresponds to a respective programming level that is represented by a certain region of analog output values. The relation between the analog output value of a given memory cell and the read thresholds is indicative of the memory cell's programming level, and thus of the data stored in that memory cell. Analog output values may drift over time and may be subject to various types of impairments. Thus, proper setting and adaptation of the read thresholds is important for maintaining low read error probability.

Embodiments of the present invention that are described herein provide improved methods and systems for setting read thresholds used for reading analog memory cells. The disclosed techniques are based on reading the memory cells using multiple read thresholds. The multiple read thresholds are typically all positioned in a boundary region between a given pair of programming levels. Positioning of the read thresholds defines multiple ranges of output values between the thresholds.

In each range, the number of read errors in the data corresponding to the analog output values falling in the range is assessed. In other words, the number of memory cells whose output value falls in the range even though their stored data corresponds to a different range is assessed separately for each range. One or more of the read thresholds are adjusted based on the numbers of read errors assessed for the different output value ranges. In some embodiments, the stored data is encoded with an Error Correction Code (ECC), and the numbers of errors for the different ranges are obtained from the ECC decoding process.

It is possible in principle to perform threshold adaptation based on the number of read errors relative to a single read threshold, e.g., by aiming to equalize the total number of read bits that were corrected by the ECC from "0" to "1" and the total number of bits that were corrected from "1" to "0". This technique, however, performs well only for certain types of statistical distributions of the output values, and is therefore not valid for all cases.

By considering the number of read errors that occur in multiple different ranges of output values, the disclosed techniques are able to focus on subsets of the read errors that are meaningful for threshold setting. As such, the disclosed techniques perform well under a wide variety of real-life output value distributions, such as various non-Gaussian distributions. One example of such a distribution is caused by "stuck bits," i.e., memory cells whose output values remain fixed and do not respond to programming.

Several example embodiments that use the disclosed techniques are described herein. Some embodiments use hard ECC decoding and others use soft decoding. In some embodiments, the assessed numbers of errors for the different output value ranges are used to improve initial soft decoding metrics (e.g., Log Likelihood Ratios LLRs) used for soft ECC decoding.

In other embodiments, multiple sets of read thresholds are stored in a Look-Up Table (LUT), and the appropriate set is chosen based on the read output values. Other disclosed techniques adjust the read thresholds such that the absolute number of output values falling in each range of output values matches a respective target number. In other embodiments, the data readout process is modeled in terms of a communication channel, and the read thresholds are adapted so as to maximize the channel capacity.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "Flash drives"), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32 that are arranged in word lines 34. In the context of the present patent application and in the claims, the term "analog memory cell" is used to describe any memory cell that holds a continuous, analog value of a physical parameter, such as an electrical voltage or charge. Array 32 may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. The analog values written to the memory cells are referred to herein as input analog values, and the analog values read from the memory cells are referred to as analog output values. Although the embodiments described herein mainly address threshold voltages, the methods and systems described herein may be used with any other suitable kind of analog values.

System 20 stores data in the analog memory cells by programming the cells to assume respective memory states, which are also referred to as programming states or programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The techniques described herein mainly address storage densities of a non-integer number of bits per memory cell, i.e., a number of programming levels per cell that is not an integer power of two.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. Memory controller 40 comprises an interface 44 for communicating with memory device 24, and a processor 48. The disclosed techniques can be carried out by memory controller 40, by R/W unit 36, or both. Thus, in the present context, memory controller 40 and R/W unit 36 are referred to collectively as circuitry that carries out the disclosed techniques.

Memory controller 40 communicates with a host 52, for accepting data for storage in the memory device and for outputting data retrieved from the memory device. Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines 34, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Read Threshold Setting Based on Soft Readout Statistics

In some embodiments, memory controller 40 reads a group of memory cells 32, e.g., a word line or part of a word line, using multiple read thresholds. The memory controller decodes the stored data based on the read results, i.e., based on where each cell output value falls relative to the read thresholds. The memory controller sets and adjusts the positions of the read thresholds using methods that are described below.

The description that follows refers to a specific embodiment involving two programming levels and three read thresholds. The disclosed techniques, however, are in no way limited to this embodiment, and can be generalized in a straightforward manner to any desired number of programming levels and read thresholds. For ease of explanation, the description that follows refers to the disclosed techniques as being carried out by memory controller 40. In alternative embodiments, however, these techniques can be carried out by R/W unit 36 in the memory device, or jointly by the R/W unit and the memory controller.

Figure 2:
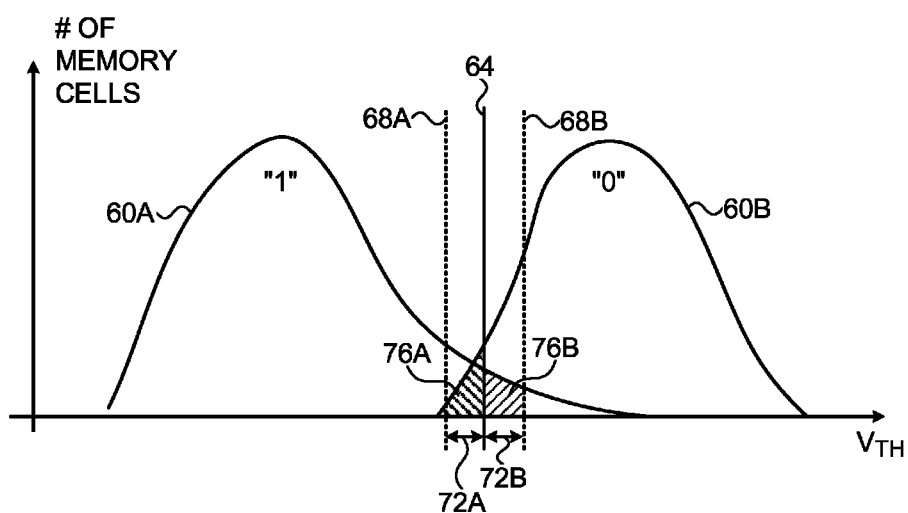
FIG. 2 is a graph showing threshold voltage distributions and read thresholds in a group of analog memory cells, in accordance with an embodiment of the present invention.

FIG. 2 is a graph showing threshold voltage distributions and read thresholds in a group of analog memory cells, in accordance with an embodiment of the present invention. In the present example, the memory cells are programmed to two programming levels corresponding to "1" and "0" bit values, respectively. Because of various impairments and inaccuracies, the threshold voltages ($V_{TH}$) of the memory cells programmed with "1" are distributed in accordance with a distribution 60A, and the threshold voltages of the memory cells programmed with "0" are distributed in accordance with a distribution 60B. Note that, as shown in the figure, the threshold voltage distributions are not necessarily Gaussian or even symmetric, and are not necessarily similar to one another. Moreover, the memory cells are not necessarily divided evenly between the programming levels.

The stored data is encoded prior to storage with an Error Correction Code (ECC), such as a Bose-Chaudhuri-Hocquenghem (BCH) code, a Low-Density Parity Check (LDPC) code or any other suitable ECC. In some embodiments, the memory controller decodes the ECC in a hard decoding process, i.e., based on a binary input for each bit. In alternative embodiments, the memory controller decodes the ECC in a soft decoding process, based on soft decoding metrics (e.g., Log Likelihood Ratios—LLRs) that are computed for the bits.

Memory controller 40 retrieves the data from the group of memory cells by setting (using R/W unit 36) one or more read thresholds, and comparing the threshold voltages of the memory cells to the read thresholds. In the present example, memory controller 40 sets a total of three thresholds—A hard threshold 64 and two soft thresholds 68A and 68B on opposite sides of the hard threshold. All three thresholds are positioned in the boundary region between the two programming levels in question.

Consider, for example, a hard readout process in which the memory controller reads any memory cell whose threshold voltage is smaller than hard threshold 64 as holding "1", and any memory cell whose threshold voltage is larger than hard threshold 64 as holding "0". In this process, the memory cells that belong to distribution 60A but whose $V_{TH}$ is larger than threshold 64 will be read erroneously as holding "0". Similarly, the memory cells that belong to distribution 60B but whose $V_{TH}$ is smaller than threshold 64 will be read erroneously as holding "1". As can be seen in the figure, proper positioning of threshold 64 is important for maintaining low error probability.

In some embodiments, memory controller 40 adjusts the position of hard threshold 64 using the following process: The memory controller reads the memory cells using all three read thresholds (hard threshold 64 and soft thresholds 68A and 68B). The three thresholds define two finite ranges (intervals) 72A and 72B of threshold voltages that fall between the thresholds. For each of the two ranges (intervals 72A and 72B), the memory controller assesses the number of read errors occurring in the range.

The assessed numbers of errors are illustrated graphically in FIG. 2: A shaded region 76A corresponds to the memory cells that belong to distribution 60B and whose $V_{TH}$ falls between thresholds 64 and 68A. Thus, the area of region 76A is indicative of the number of read errors occurring in interval 72A. Similarly, a shaded region 76B corresponds to the memory cells belonging to distribution 60A and whose $V_{TH}$ falls between thresholds 64 and 68B. The area of region 76A is thus indicative of the number of read errors occurring in interval 72B.

In some embodiments, memory controller 40 adjusts the position of hard threshold 64 based on the number of read errors falling in intervals 72A and 72B. Typically, the memory controller adjusts thresholds 64 so as to equalize these two numbers. In other words, if the number of read errors in interval 72A is greater than the number or read errors in interval 72B, the memory controller decreases threshold 64 (i.e., moves it to the left). If the number of read errors in interval 72A is smaller than the number or read errors in interval 72B, the memory controller increases threshold 64. Soft thresholds 68A and 68B are typically adjusted together with threshold 64, so as to maintain the separations between the thresholds.

In some embodiments, the numbers of read errors are used for deciding on the direction in which the threshold is to be adjusted, but the amount of adjustment is set regardless of these numbers (e.g., at fixed or predefined increments). In other embodiments, the memory controller sets the size of the adjustment based on the numbers of read errors, e.g., based on the ratio between the numbers.

In the disclosed technique, the threshold is adjusted based on the numbers of errors that occur in close proximity to the threshold. This choice is in contrast to basing the adjustment on the total numbers of read errors (the total number of memory cells in distribution 60A whose $V_{TH}$ falls above threshold 64, and the total number of memory cells in distribution 60B whose $V_{TH}$ falls below threshold 64). As a result, the threshold adjustment process is not sensitive to the actual shapes of distributions 60A and 60B.

Typically, within each interval (e.g., 72A or 72B) the $V_{TH}$ distribution is approximately Gaussian, and therefore the direction and size of the read threshold adjustment can be computed with high accuracy and reliability.

For example, in some scenarios, a number of memory cells are stuck at certain threshold voltages regardless of programming. These stuck threshold voltages are, with high probability, not in the vicinity of hard threshold 64. This phenomenon is sometimes referred to as "stuck cells" or "stuck bits." Such stuck memory cells typically distort the shapes of the $V_{TH}$ distributions and cause them to deviate from Gaussian. Therefore, the correct adjustment of threshold 64 is by equalizing the total number of read errors while ignoring the "stuck cells." The disclosed technique overcomes the distorting effect of stuck memory cells, since it considers only the read errors that occur in proximity to the hard read threshold.

Generally, considering the numbers of read errors in finite intervals that are close to the read thresholds makes the disclosed technique highly robust and performs well regardless of the actual $V_{TH}$ distributions.

Memory controller 40 may assess the numbers of read errors in the various $V_{TH}$ ranges (e.g., in intervals 72A and 72B) using any suitable method. In some embodiments, the ECC decoding process in the memory controller is able to output the number of corrected read errors ("0" to "1", and "1" to "0") for each interval separately. Alternatively, any other suitable method can be used for assessing the numbers of read errors in the various $V_{TH}$ ranges.

Figure 3:
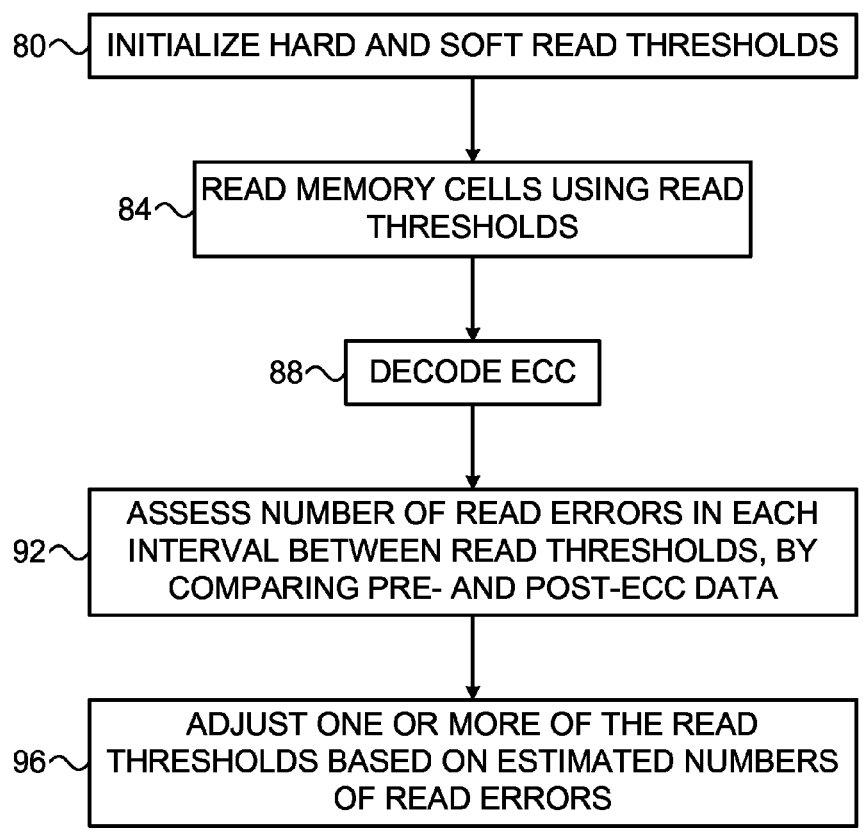
FIG. 3 is a flow chart that schematically illustrates a method for adjusting read thresholds, in accordance with an embodiment of the present invention.

FIG. 3 is a flow chart that schematically illustrates a method for adjusting read thresholds, in accordance with an embodiment of the present invention. The method begins with memory controller 40 initializing hard threshold 64 and soft thresholds 68A and 68B to some initial positions, at an initialization step 80. The memory controller then reads a group of memory cells using the three read thresholds, at a readout step 84. The memory controller decodes the ECC, at an ECC decoding step 88. ECC decoding may be hard (i.e., based on the read results of threshold 64) or soft (i.e., based on the read results of thresholds 64, 68A and 68B).

Memory controller 40 then assesses the number of read errors for each of intervals 72A and 72B between the read thresholds, at an error assessment step 92. For example, the memory controller may compare the data before and after ECC correction, or accept from the ECC decoding process a respective count of the corrected errors for each interval. In the example of FIG. 2, the memory controller assesses the number of "0"→"1" errors in interval 72A, and the number of "1"→"0" errors in interval 72B. The memory controller adjusts one or more of the read thresholds based on the numbers of read errors assessed for the different intervals, at a threshold adjustment step 96.

In some of the disclosed embodiments, the memory controller assesses the number of errors based on outputs from the ECC decoding process following successful ECC decoding. In practice, however, ECC decoding may sometimes fail. In such cases, the memory controller may attempt ECC decoding on another group of memory cells (either in the same word line or in a different word line), estimate the read threshold positions on that group, and use the resulting read threshold for reading the memory cells for which ECC decoding has failed. The disclosed techniques can be used for adapting the read thresholds and performing data readout using the adapted read thresholds on the same group of memory cells, or for adapting the read thresholds on one group of memory cells and performing data readout using the adapted read thresholds on a different group of memory cells.

The embodiment of FIGS. 2 and 3 above refers to a readout scheme that differentiates between two programming levels using three read thresholds that define a total of four output value intervals: two finite intervals 72A and 72B, an infinite interval below threshold 68A and an infinite interval above threshold 68B. The disclosed technique adapts the read thresholds based on the number of errors occurring in the two finite intervals 72A and 72B. In alternative embodiments, the disclosed technique can be used with any desired number of read thresholds and intervals, such as a scheme that uses five read thresholds defining a total of six intervals.

The memory controller may set the separations of the soft thresholds from the hard threshold (i.e., the sizes of intervals 72A and 72B) based on any suitable criterion. In some embodiments, the separations are fixed and predetermined. In some embodiments, the memory controller sets the separations based on the $V_{TH}$ distributions, e.g., based on the Cumulative Distribution Function (CDF) of the $V_{TH}$ distributions.

In an example embodiment, the memory controller sets the separation of a given soft threshold such that a predefined percentage of the memory cells will have $V_{TH}$ that falls between this soft threshold and the hard threshold. The memory controller may adapt the size of intervals 72A and 72B in accordance with such a criterion. When using this criterion, the separation between the hard threshold and a soft threshold typically changes according to the quality of the memory media (e.g., from start-of-life to end-of-life).

In some embodiments, the memory controller sets the read thresholds such that the absolute number of memory cells in intervals 72A and 72B will match a pre-defined target number. These techniques are particularly useful when ECC decoding fails and the actual numbers of errors are unknown. In some of these embodiments, the memory controller may set the read thresholds without prior knowledge of the $V_{TH}$ distribution CDF, by explicitly setting the number of memory cells in the intervals.

Alternatively, if the CDF or its approximation is known in advance, the CDF can be used to decide how many cells should be included in intervals 72A and 72B such that most of the read errors will occur in the intervals. In these embodiments, the memory controller sets the numbers of memory cells in intervals 72A and 72B according to the CDF, and the read thresholds are set to meet these numbers during data readout. This setting can be performed without a need to know where the errors occur, e.g., without a need for successful ECC decoding.

In some embodiments, the memory controller may hold a set of multiple CDFs, for example CDFs typical of start-of-life and end-of-life conditions, CDFs typical of cycling at various levels, CDFs typical of combined cycling and retention, or any other suitable CDFs. The memory controller may choose the appropriate CDF from the set using side information (e.g. the number of programming and erasure cycles applied to the memory cells). Alternatively, the memory controller may estimate which CDF to use based on the data (e.g. according to the width or standard deviation of the $V_{TH}$ distribution), or apply a worst-case CDF in all cases.

Using Soft Readout Statistics to Set the Spacing Between Soft Read Thresholds

In some embodiments, memory controller 40 decodes the ECC in a soft decoding process. Typically, each read bit is assigned a respective soft metric, and the memory controller decodes the ECC based on the soft metrics. Each soft metric indicates the confidence of the respective bit being "1" or "0". The embodiments described herein refer mainly to LLRs, but the disclosed techniques can be used with any other suitable kind of soft metrics.

In an example embodiment, the memory controller assigns the soft metric to a given read bit depending on the interval in which the corresponding output value ($V_{TH}$) falls. In the embodiment of FIG. 2, for example, the memory controller typically assigns high soft metrics to the memory cells as follows:

| Cell VTH location | Assigned LLR |
|---|---|
| In interval 72A | "1" with small confidence |
| In interval 72B | "0" with small confidence |

-continued

| Cell VTH location | Assigned LLR |
|---|---|
| Below read threshold 68A (below interval 72A) | "1" with high confidence |
| Above read threshold 68B (above interval 72B) | "0" with high confidence |

In this scheme, memory cells whose $V_{TH}$ is far from the read thresholds are assigned high confidence, since they are unlikely to cause read errors. Memory cells whose $V_{TH}$ is close to the read thresholds are assigned low confidence, since they are more likely to cause read errors.

In some embodiments, memory controller 40 adjusts the separation between the read thresholds (e.g., the distance between the hard threshold and each of the soft thresholds) based on the number of read errors assessed for each interval. In the embodiment of FIG. 2, for example, it is typically desirable that most of the read errors will occur within intervals 72A and 72B, and only few errors would occur outside these intervals. This sort of setting would yield high-performance soft decoding.

In an example embodiment, memory controller 40 adjusts the separation between hard threshold 64 and soft threshold 68A so that most of the read errors will occur within interval 72A. The memory controller may check this condition, for example, by comparing the number of errors within interval 72A to the total number of read errors occurring below threshold 64. A similar process may be carried out for threshold 68B and interval 72B, or jointly for both thresholds 68A and 68B. As another example, the memory controller may use additional soft read thresholds and additional ranges (not shown in FIG. 2) in order to assess the number of errors falling outside intervals 72A and 72B.

The memory controller may use any suitable criterion for adjusting the separation between a given soft threshold and the hard threshold, based on the number of read errors occurring in the $V_{TH}$ interval between these thresholds (e.g., adapt the size of interval 72A based on the number of errors occurring in this interval). In an example embodiment, the memory controller adapts the separation such that the number of errors in the interval reaches a desired value. As another example, the memory controller may adapt the separation such that a ratio between the number of errors and the number of memory cells in the interval reaches a desired value. This condition is substantially equivalent to setting a constant LLR for the memory cells in the interval.

In some embodiments, the memory controller holds a mapping, e.g., Look-Up Table (LUT), of definitions of optimal read threshold positions that are calculated using the disclosed techniques. In one example embodiment, the table is addressed by the distance between the programming level $V_{TH}$ distributions and by the variance of the $V_{TH}$ distribution. In other embodiments, the LUT can be accessed by the distance between the programming level $V_{TH}$ distributions, the variance of the $V_{TH}$ distribution, the width of the $V_{TH}$ distribution (i.e., the size of the interval containing X % of the analog values belonging to the distribution, e.g., 99.9%), any suitable combination of these parameters and/or any other suitable parameter of the analog values.

The memory controller estimates the distance between levels and the distribution variance, and accesses the LUT with these values to obtain the optimal read threshold setting. The LUT is typically prepared in advance based on an assumed $V_{TH}$ distribution model, which depends on a relatively small number of $V_{TH}$ parameters (such as the $V_{TH}$ distribution variance and distance between programming levels). During readout, the $V_{TH}$ parameters are estimated from the read data and used for accessing the LUT to estimate the thresholds. In an alternative embodiment, the LUT holds only the separations between the read thresholds, and the hard threshold is estimated using other methods.

In an example embodiment, the memory controller may use the variance of the $V_{TH}$ distribution as input to the LUT, in order to obtain the separation between the hard threshold and the soft thresholds (without having to count the number of read errors or the absolute number of memory cells per interval). In another embodiment, the memory controller may start with an initial threshold separation, count the number of errors or absolute number of cells per interval, and use the LUT to obtain the optimal threshold separation. Further alternatively, the memory controller may adapt the read threshold positions based on the definitions in the LUT, and in particular the separation between read thresholds, in any other suitable manner.

Generally, the above-described technique is not limited to LUTs. The memory controller may hold any suitable kind of mapping that defines multiple sets of read threshold values depending on one or more parameters related to the analog output values (e.g., $V_{TH}$) read from the memory cells. Alternatively to LUT, the mapping may comprise, for example, an analytical function. The mapping may define the read thresholds in various ways. For example, the mapping may give the absolute positions of the read thresholds, or the separations between them. In the latter case, the absolute position of at least one of the read thresholds may be calculated using other suitable methods.

In alternative embodiments, the threshold setting problem can be modeled in terms of maximizing communication channel capacity. In these embodiments, the memory is modeled as a communication channel: The input to the channel corresponds to the bits programmed into a memory cell, and the channel output corresponds to the analog output values (e.g., $V_{TH}$) of the memory cell, quantized according to the read thresholds. For example, for three read thresholds, the channel output comprises one of four possible intervals in which the memory cell $V_{TH}$ may fall. For such a channel, given the $V_{TH}$ distribution shape, the channel capacity can be calculated. (The capacity in this case is typically defined as the maximum number of bits that can be stored in a memory cell such that there exists a readout algorithm that enables to read the data with error probability as low as desired.) Capacity is typically calculated as a function of the positions (or separation) of the read thresholds, and the position that maximizes capacity is chosen.

In the example of FIG. 2, the channel in question has two inputs (read bit value being "1" or "0") and four outputs (cell output value falling below threshold 68A, between thresholds 68A and 64, between thresholds 64 and 68B, or above threshold 68B). For a given $V_{TH}$ distribution, the channel capacity can be computed as a function of the soft threshold positions. In some embodiments, the memory controller adapts the read threshold positions so as to maximize the channel capacity.

In an example embodiment, the memory controller may set the separation such that the resulting capacity will be maximized, without having to count the number of errors or the absolute number of cells per interval. In another embodiment, the memory controller may try several read threshold separations (or read threshold positions), count the number of errors (or absolute number of cells) per interval, and deduce the read threshold positions that maximize channel capacity based on this information. Further alternatively, the memory controller may adapt the read threshold positions based on maximizing channel capacity in any other suitable manner.

In some embodiments, memory controller 40 may carry out a readout process that combines soft decoding and cancellation of interference from neighboring memory cells. Processes of this sort are described, for example, in U.S. Patent Application Publication 2009/0024905, whose disclosure is incorporated herein by reference. For example, the memory controller may read neighboring cells, estimate their impact on a certain target cell, and compensate for this impact when recovering the data from the target cell.

Any of the techniques described herein, e.g., the techniques that set the read thresholds based on the number of read errors or the number of memory cells per interval, may take into account the interference coefficients when determining the read threshold positions. The interference coefficient may be estimated from the read data, or they may be known in advance.

When the memory controller carries out interference cancellation, the number of read errors per interval (which are used for estimating the read thresholds) can be defined as the total number of errors, e.g., as counted by comparing the correct data with the original data, as read with the hard threshold. Alternatively, the number of read errors per interval can be defined as the number of read errors after the interference is taken into account. In other words, if the interference cancellation process changes the hard bit value of a given memory cell, then the changed bit value can be used as reference and not the original bit read with the hard threshold.

Using Soft Readout Statistics to Improve Initial LLR'S

When the memory controller uses a soft ECC decoding process, each bit is assigned an initial LLR (or other soft metric) that indicates the confidence of this bit being "0" or "1". In some embodiments, the memory controller assigns for each soft interval a predefined initial LLR value. However, the initial LLRs that maximize the probability of successful decoding may vary according to the $V_{TH}$ distribution. Thus, the memory controller can adjust the initial LLRs based on the numbers of read errors assessed for the various $V_{TH}$ intervals to improve the initial LLRs to be used in subsequent read operations. For example, after successful ECC decoding, the memory controller may compute an "empirical LLR" for each $V_{TH}$ interval.

The empirical LLR of a given $V_{TH}$ interval indicates, based on past results, the empirical probability of a cell whose $V_{TH}$ falls in this interval being "1" or "0". In an embodiment, memory controller 40 computes the empirical LLR of a given $V_{TH}$ interval based on the number of correct bits and the number of errors occurring in that interval. These numbers are typically obtained from the ECC decoding process. The empirical LLRs can be used as initial LLRs in subsequent readout operations, so as to improve decoding performance.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
storing data in memory cells;
after storing the data, reading the memory cells using multiple read thresholds to produce respective output values, wherein the multiple read thresholds define multiple ranges of the output values;
assessing a number of read errors in the data corresponding to the output values included in each of the ranges, wherein the output values of the data included in each of the ranges are bounded by read thresholds of the multiple read thresholds associated with each range; and
recovering the stored data based on the number of read errors assessed in each of the ranges.

2. The method according to claim 1, wherein recovering the stored data comprises adjusting at least one of the read thresholds based on the number of read errors in at least one of the ranges, and retrieving the data from the memory cells using the adjusted read thresholds.

3. The method according to claim 2, wherein adjusting the read thresholds comprises adapting the read thresholds based on the number of read errors in at least one of the ranges assessed in a first group of the memory cells, and wherein retrieving the data comprises reading the data from a second group of the memory cells using the adapted read thresholds.

4. The method according to claim 2, wherein adjusting the read thresholds comprises adapting the read thresholds based on the number of read errors in at least one of the ranges assessed in a given group of the memory cells, and wherein retrieving the data comprises reading the data from the given group of the memory cells using the adapted read thresholds.

5. The method according to claim 2, wherein adjusting the read thresholds comprises moving the multiple read thresholds while maintaining separations between the read thresholds.

6. The method according to claim 2, wherein adjusting the read thresholds comprises modifying one or more separations between the read thresholds.

7. The method according to claim 2, further comprising using a look-up table that maps multiple sets of the read thresholds to one or more parameters related to the output values, wherein adjusting the read thresholds comprises estimating the parameters based on the read output values, and obtaining the read thresholds from the look-up table using the estimated parameters.

8. The method according to claim 1, wherein the read thresholds comprise at least a hard threshold and two soft thresholds on opposite sides of the hard threshold, and wherein the ranges comprise at least a first range between the hard threshold and one of the soft thresholds, and a second range between the hard threshold and the other of the soft thresholds.

9. The method according to claim 1, wherein storing the data comprises programming each memory cell to a respective one of multiple programming levels, and wherein reading the analog output values comprises positioning the multiple read thresholds in a boundary region between a given pair of the programming levels.

10. The method according to claim 1, wherein recovering the stored data comprises computing soft decoding metrics based on the number of read errors in at least one of the ranges, and decoding an Error Correction Code (ECC) that encodes the stored data using the soft decoding metrics.

11. The method according to claim 10, wherein recovering the stored data comprises computing the soft decoding metrics over a first group of the memory cells, and decoding the ECC that encodes the data stored in a second group of the memory cells.

12. The method according to claim 1, wherein storing the data comprises encoding the data with an Error Correction Code (ECC), and wherein assessing the number of read errors in each range comprises correcting the read errors using the ECC and determining a respective count of the read errors in each range that were corrected by the ECC.

13. The method according to claim 1, wherein storing the data comprises programming each memory cell to a respective one of multiple programming levels, and wherein the output values corresponding to at least one of the programming levels are distributed in accordance with a non-Gaussian distribution.

14. A data storage apparatus, comprising:
an interface configured to communicate with a memory, wherein the memory includes a plurality of memory cells; and
circuitry configured to:
store data in the memory cells of the memory;
read, after storing the data, the memory cells using multiple read thresholds to produce respective output values of the data, wherein the multiple read thresholds define multiple ranges of the output values;
assess a number of read errors in the data corresponding to the output values included in each of the ranges, wherein the output values of the data included in each of the ranges are bounded by associated read thresholds; and
recover the stored data based on the number of the read errors assessed in each of the ranges.

15. The apparatus according to claim 14, wherein to recover the stored data, the circuitry is further configured to adjust at least one of the read thresholds based on the number of read errors in at least one of the ranges, and retrieving the data from the memory cells using the adjusted read thresholds.

16. The apparatus according to claim 15, wherein the circuitry is further configured to adjust the read thresholds based on the number of read errors in at least one of the ranges assessed in a first group of the memory cells, and to retrieve the data from a second group of the memory cells using the adjusted read thresholds.

17. The apparatus according to claim 15, wherein the circuitry is further configured to adjust the read thresholds based on the number of read errors in at least one of the ranges assessed in given group of the memory cells, and to retrieve the data from the given group of the memory cells using the adjusted read thresholds.

18. The apparatus according to claim 15, wherein the circuitry is further configured to move the multiple read thresholds while maintaining separations between the read thresholds.

19. The apparatus according to claim 15, wherein the circuitry is further configured to modify one or more separations between the read thresholds.

20. The apparatus according to claim 15, wherein the circuitry is further configured use a look-up table that maps multiple sets of read thresholds to one or more parameters related to the output values, and to adjust the read thresholds by estimating the parameters based on the read output values, and obtaining the read thresholds from the look-up table using the estimated parameters.

21. The apparatus according to claim 14, wherein the read thresholds comprise at least a hard threshold and two soft thresholds on opposite sides of the hard threshold, and wherein the ranges comprise at least a first range between the hard threshold and one of the soft thresholds, and a second range between the hard threshold and the other of the soft thresholds.

22. The apparatus according to claim 14, wherein the circuitry is further configured to program each memory cell to a respective one of multiple programming levels, and to position the multiple read thresholds in a boundary region between a given pair of the programming levels.

23. The apparatus according to claim 14, wherein the circuitry is further configured to recover the stored data by computing soft decoding metrics based on the number of read errors in at least one of the ranges, and decoding an Error Correction Code (ECC) that encodes the stored data using the soft decoding metrics.

24. The apparatus according to claim 23, wherein the circuitry is further configured to compute the soft decoding metrics over a first group of the memory cells, and to decode the ECC that encodes the data stored in a second group of the memory cells.

25. The apparatus according to claim 14, wherein the circuitry is further configured to encode the stored data with an Error Correction Code (ECC), and to assess the number of read errors in each range by correcting the read errors using the ECC and determining a respective count of the read errors in each range that were corrected by the ECC.

26. The apparatus according to claim 14, wherein the circuitry is further configured to program each memory cell to a respective one of multiple programming levels, and wherein the output values corresponding to at least one of the programming levels are distributed in accordance with a non-Gaussian distribution.

27. A data storage apparatus, comprising:
a memory comprising a plurality of memory cells; and
circuitry configured to:
store data in the memory cells of the memory;
read, after storing the data, the memory cells using multiple read thresholds to produce respective output values of the data, wherein the multiple read thresholds define multiple ranges of the output values;
assess a number of read errors in the data corresponding to the output values included in each of the ranges, wherein the output values of the data included in each of the ranges are bounded by associated read thresholds; and
adjust at least one of the read thresholds based on the number of read errors assessed in each of the ranges.

28. A method for data storage, comprising:
storing data in analog memory cells by programming the memory cells with respective analog input values;
setting multiple read thresholds for reading respective analog output values from the memory cells, wherein the read thresholds define multiple ranges of the analog output values and are set such that a respective number of the analog output values occurring in each range matches a respective value; and
retrieving the stored data by reading the analog output values from the memory cells using the multiple read thresholds.

29. The method according to claim 28, wherein setting the read thresholds comprises estimating one or more Cumulative Distribution Functions (CDFs) of the analog output values, and setting the read thresholds based on the estimated CDFs.

30. The method according to claim 28, and comprising holding a mapping that defines multiple sets of the read thresholds depending on one or more parameters related to the analog output values, wherein setting the read thresholds comprises estimating the parameters based on the read analog output values, and obtaining the read thresholds from the mapping using the estimated parameters.

31. A data storage apparatus, comprising:
an interface, which is configured to communicate with a memory comprising analog memory cells; and
circuitry, which is configured to store data in the analog memory cells by programming the memory cells with respective analog input values, to set multiple read thresholds for reading respective analog output values from the memory cells, wherein the read thresholds define multiple ranges of the analog output values and are set such that a respective number of the analog output values occurring in each range matches a respective value, and to retrieve the stored data by reading the analog output values from the memory cells using the multiple read thresholds.

32. The apparatus according to claim 31, wherein the circuitry is configured to estimate one or more Cumulative Distribution Functions (CDFs) of the analog output values, and to set the read thresholds based on the estimated CDFs.

33. The apparatus according to claim 31, wherein the circuitry is configured to hold a mapping that defines multiple sets of the read thresholds depending on one or more parameters related to the analog output values, and to set the read thresholds by estimating the parameters based on the read analog output values, and obtaining the read thresholds from the mapping using the estimated parameters.

34. A data storage apparatus, comprising:
a memory comprising analog memory cells; and
circuitry, which is configured to store data in the analog memory cells by programming the memory cells with respective analog input values, to set multiple read thresholds for reading respective analog output values from the memory cells, wherein the read thresholds define multiple ranges of the analog output values and are set such that a respective number of the analog output values occurring in each range matches a respective value, and to retrieve the stored data by reading the analog output values from the memory cells using the multiple read thresholds.

35. A method for data storage, comprising:
using a look-up table that maps multiple sets of read thresholds for reading memory cells to one or more parameters related to values read from the memory cells;
storing data in a group of the analog memory cells;
after storing the data, reading respective output values from the memory cells in the group and estimating the parameters based on the read output values; and
setting the read thresholds for subsequent read operations dependent upon the look-up table, using the estimated parameters.

36. The method according to claim 35, wherein the parameters comprise at least one parameter type selected from a group of types consisting of a variance of a distribution of at least some of the output values, a width of the distribution of at least some of the output values, and a distance between distributions of subsets of the output values.

37. A data storage apparatus, comprising:
an interface, which is configured to communicate with a memory comprising analog memory cells; and
circuitry, which is configured to hold a mapping that defines multiple sets of read thresholds for reading analog memory cells depending on one or more parameters related to analog values read from the memory cells, to store data in a group of the analog memory cells by programming the memory cells in the group with respective analog input values, to read, after storing the data, respective analog output values from the memory cells in the group and to estimate the parameters based on the read analog output values, and to set the read thresholds for subsequent readout operations based on the mapping using the estimated parameters.

38. The apparatus according to claim 37, wherein the parameters comprise at least one parameter type selected from a group of types consisting of a variance of a distribution of at least some of the analog output values, a width of the distribution and a distance between distributions of subsets of the analog output values.

39. A data storage apparatus, comprising:
a memory comprising analog memory cells; and
circuitry, which is configured to hold a mapping that defines multiple sets of read thresholds for reading analog memory cells depending on one or more parameters related to analog values read from the memory cells, to store data in a group of the analog memory cells by programming the memory cells in the group with respective analog input values, to read, after storing the data, respective analog output values from the memory cells in the group and to estimate the parameters based on the read analog output values, and to set the read thresholds for subsequent readout operations based on the mapping using the estimated parameters.

* * * * *

UNITED STATES PATENT AND TRADEMARK OFFICE
CERTIFICATE OF CORRECTION

| | | |
|---|---|---|
| PATENT NO. | : 8,694,854 B1 | Page 1 of 1 |
| APPLICATION NO. | : 13/195852 | |
| DATED | : April 8, 2014 | |
| INVENTOR(S) | : Ronen Dar et al. | |

It is certified that error appears in the above-identified patent and that said Letters Patent is hereby corrected as shown below:

In the Claims:

Claim 7, Column 16, Line 44, please delete "of the" and substitute -- of --

Claim 9, Column 16, Line 60, please delete "analog output" and substitute -- output --

Claim 14, Column 17, Line 33, please delete "of the" and substitute -- of --

Signed and Sealed this
Second Day of September, 2014

Michelle K. Lee
*Deputy Director of the United States Patent and Trademark Office*